United States Patent
Shiue

(10) Patent No.: US 9,318,787 B2
(45) Date of Patent: Apr. 19, 2016

(54) TRANSMISSION LINE STRUCTURE INCLUDING A FIRST TRANSMISSION LINE PAIR CROSSING OVER A SECOND TRANSMISSION LINE AT A SPECIFIED ANGLE

(71) Applicant: Chung Yuan Christian University, Chung Li (TW)

(72) Inventor: Guang-Hwa Shiue, Chung Li (TW)

(73) Assignee: CHUNG YUAN CHRISTIAN UNIVERSITY, Chung Li (TW)

( * ) Notice: Subject to any disclaimer, the term of this patent is extended or adjusted under 35 U.S.C. 154(b) by 0 days.

(21) Appl. No.: 14/461,074

(22) Filed: Aug. 15, 2014

(65) Prior Publication Data
US 2015/0382450 A1 Dec. 31, 2015

(30) Foreign Application Priority Data
Jun. 25, 2014 (TW) .............................. 103121909 A

(51) Int. Cl.
*H01P 3/08* (2006.01)
*H05K 1/02* (2006.01)

(52) U.S. Cl.
CPC *H01P 3/088* (2013.01); *H01P 3/08* (2013.01); *H05K 1/0228* (2013.01); *H05K 1/0245* (2013.01)

(58) Field of Classification Search
CPC ......... H01P 3/003; H01P 3/006; H01P 3/082; H01P 3/088; H05K 1/0245; H05K 1/0228
USPC ............................................................. 333/1
See application file for complete search history.

(56) References Cited

U.S. PATENT DOCUMENTS

| | | | |
|---|---|---|---|
| 3,104,363 A * | 9/1963 | Butler | 333/246 |
| 5,907,265 A * | 5/1999 | Sakuragawa et al. | 333/1 |
| 2012/0229998 A1 * | 9/2012 | Kagaya | 361/777 |

* cited by examiner

*Primary Examiner* — Benny Lee
(74) *Attorney, Agent, or Firm* — Muncy, Geissler, Olds & Lowe, P.C.

(57) ABSTRACT

A transmission line structure emplaces at a substrate which includes a first layout layer, a first dielectric layer, a second dielectric layer, a second dielectric layer, and a grounding layer includes a first transmission line pair and at least one second transmission line. The first transmission line pair is set on the first layout layer. The second transmission line is set on the second layout layer. A line of first transmission line pair and a line of the second transmission line cross each other and form a crossing area. A width of the line is narrow. A distance between the first transmission line pair and the second transmission line at the crossing area is less than a distance at an outstanding area.

4 Claims, 21 Drawing Sheets

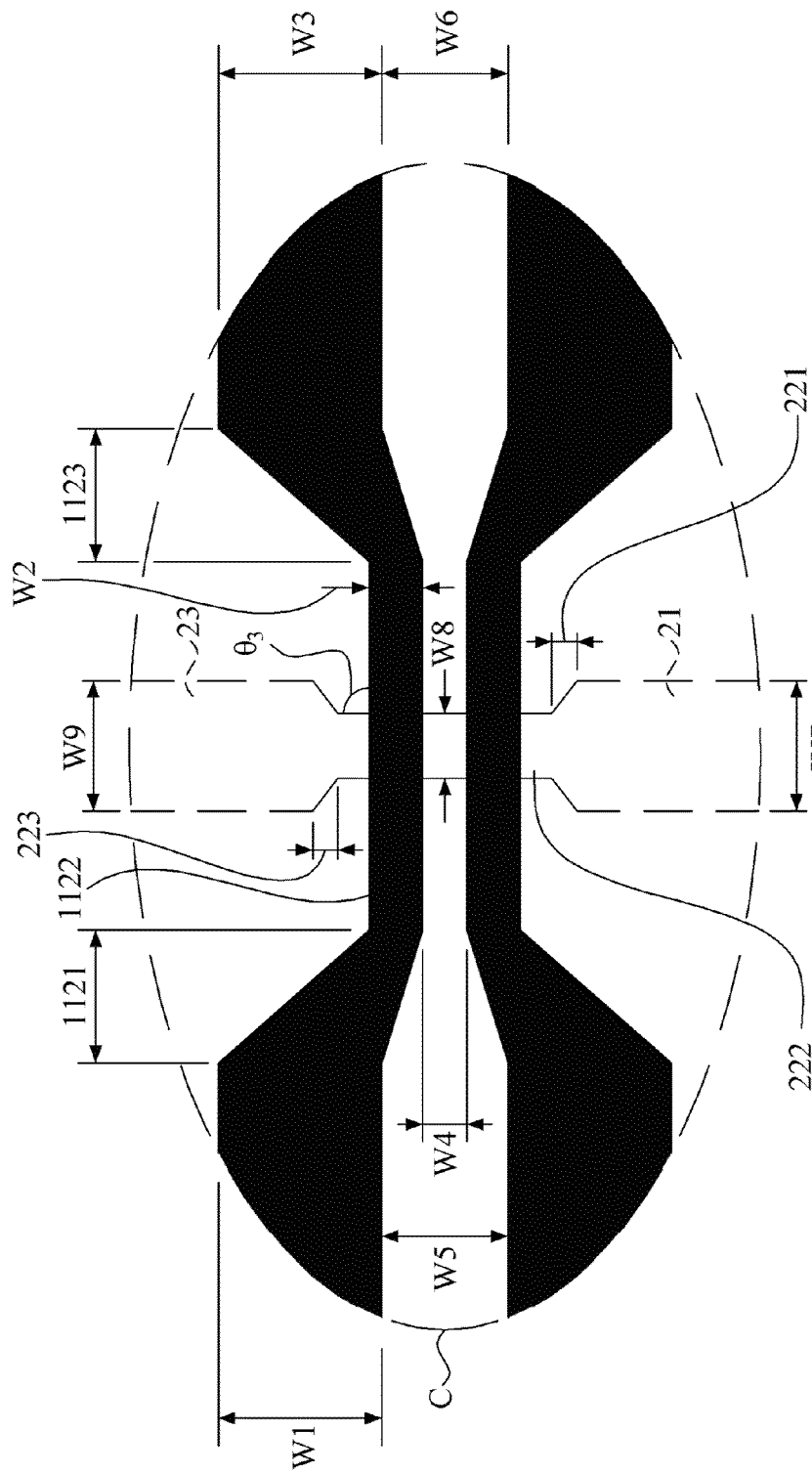

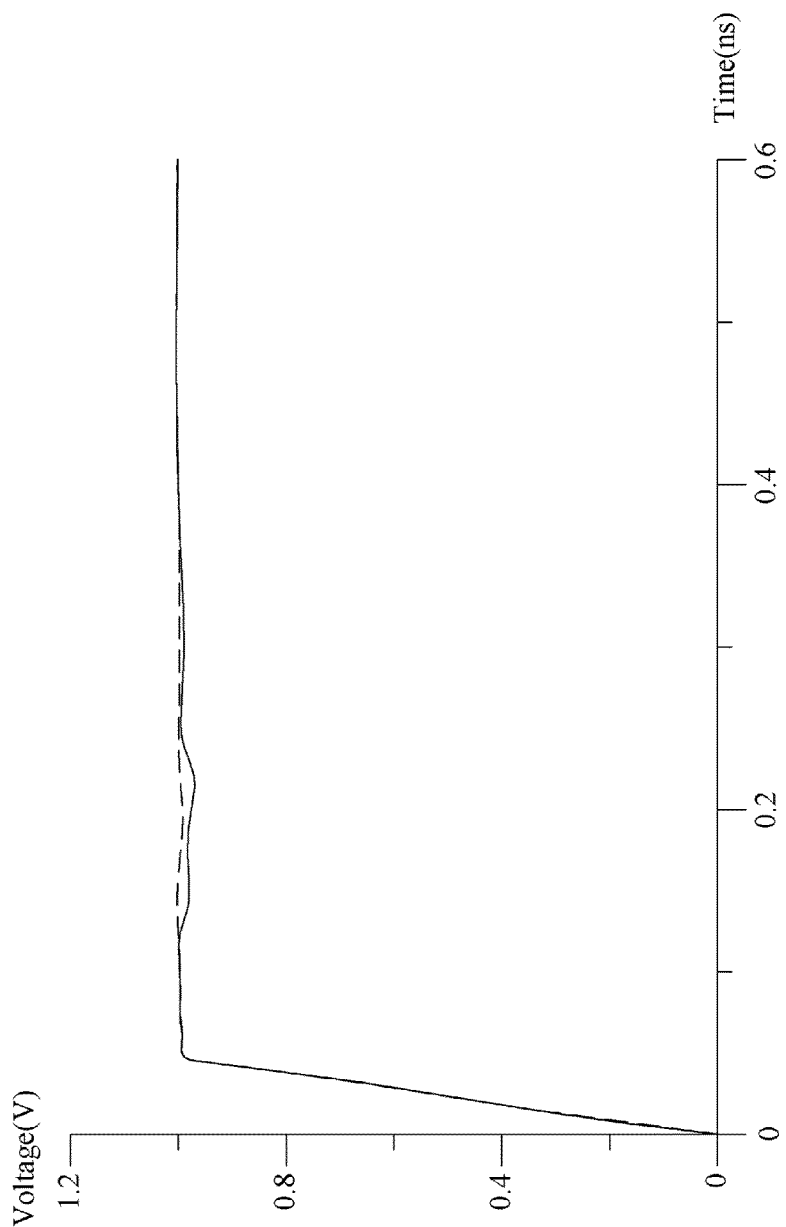

US 9,318,787 B2

TRANSMISSION LINE STRUCTURE INCLUDING A FIRST TRANSMISSION LINE PAIR CROSSING OVER A SECOND TRANSMISSION LINE AT A SPECIFIED ANGLE

FIELD OF THE INVENTION

The present invention relates to a transmission line structure, and more particularly, relates to a transmission line structure with lines close to each other at a crossing area.

BACKGROUND OF THE INVENTION

Attending with the developments of electronic technologies, more and more high frequency electronic products are available in the market, and digital signal transmission speed also becomes faster and faster. Meanwhile, with the industrial tendency toward high frequency and high speed, some communication related issues, such as electromagnetic interference (EMI), electromagnetic compatibility (EMC), signal integrity (SI), and power integrity (PI), become significant because of the increasing of transmission speed. Thus, signal quality and integrity has become a concern of circuit design.

In detail, conventional single-ended signal lines cannot match the need of high frequency system to keep good signal integrity. Thus, most high frequency and high speed digital systems nowadays apply differential signal line pair, which has the features of common-mode noise suppression and noise interference resistance, to transmit signals. The important transmission standards, such as high definition multimedia interface (HDMI), serial advanced technology attachment (SATA), USB 3.0, PCI Express, and Thunderbolt®, have the signals transmitted by the way of differential transmission. However, asymmetrical lines in the differential signal line pair will result in time difference of the received signals, which may cause the generation of common-mode noise.

Take the transmission line on the printed circuit board of the above mentioned high frequency and high speed products as an example. FIG. 1 is a first schematic view showing a conventional transmission line structure. As shown in FIG. 1, a transmission line pair PA1 extended from a first input end (at the left hand side of the figure but not labeled) to a first output end (at the right hand side of the figure but not labeled) is composed of transmission lines PA11 and PA12 which are set on the uppermost layout layer (the first layout layer, not labeled in the figure) of the substrate PA100, the transmission line PA2 extended from a second input end (the lower side of the figure but not labeled) to a second output end (the upper side of the figure but not labeled) is set on the layout layer just below the uppermost layout layer (the second layout layer, not labeled in the figure) of the substrate PA100. That is, the transmission line pair PA1 and the transmission line PA2 are located at different layers and cross each other to form a crossing area A. The crossing area A not only generates the common-mode noise but also shows a higher capacitance to influence signal integrity.

FIG. 2 is a second schematic view showing another conventional transmission line structure. As shown in FIG. 2, a transmission line pair PA3 extended from a first input end (at the left hand side of the figure but not labeled) to a first output end (at the right hand side of the figure but not labeled) is composed of transmission lines PA31 and PA32 which are set on the uppermost layout layer (the first layout layer, not labeled in the figure) of the substrate PA200, the transmission line pair PA4 extended from a second input end (the lower side of the figure but not labeled) to a second output end (the upper side of the figure but not labeled) is composed of transmission lines PA41 and PA42 which are set on the layout layer just below the uppermost layout layer (the second layout layer, not labeled in the figure) of the substrate PA200. That is, the transmission line pair PA3 and the transmission line pair PA4 are located at different layers and cross each other to form a crossing area B. The crossing area B not only generates the common-mode noise but also shows a higher capacitance (electrical interference also exists between transmission lines PA41 and PA42) to influence signal integrity.

BRIEF SUMMARY OF THE INVENTION

Because the conventional transmission line structure has a common problem of low signal quality due to large common-mode noise and high capacitance, it is a major object of the present invention to provide a transmission line structure to reduce common-mode noise and capacitance at the crossing area mainly by the ways of shrinking the line width and having the transmission lines on the upper layer close to each other and also shrinking the line width of the transmission line on the low layer.

Accordingly, a transmission line structure emplacing at a substrate is provided in the present invention. The substrate includes a first layout layer, a first dielectric layer, a second layout layer, a second dielectric layer, and a grounding layer, the first layout layer being set on the first dielectric layer, the first dielectric layer being set on the second layout layer, the second layout layer being set on the second dielectric layer, and the second dielectric layer being set on the grounding layer. The transmission line structure comprises a first transmission line pair and at least one second transmission line. The first transmission line pair is extended from a first input end to a first output end and is set on the first layout layer. The first transmission line pair also comprises a first main line, a first crossing line, and a second main line. The first main line is extended from the first input end. The first crossing line comprises a first intermediate section, a first crossing section, and a second intermediate section. The first intermediate section is connected to the first main line and has a line width decreasing along a first extending direction. The first crossing section is connected to the first intermediate section and has a fixed line width. The second intermediate section is connected to the first crossing section and has a line width increasing along the first extending direction. The second main line is connected to the second intermediate section of the first crossing line and is extended to the first output end.

The second transmission line is extended from a second input end to a second output end and is set on the second layout layer. The second transmission line comprises a third main line, a second crossing line, and a fourth main line. The third main line is extended from the second input end. The second crossing line comprises a third intermediate section, a second crossing section, and a fourth intermediate section. The third intermediate section is connected to the third main line and has a line width decreasing along a second extending direction. The second crossing section is connected to the third intermediate section and has a fixed line width. The fourth intermediate section is connected to the second crossing section of the second crossing line and has a width increasing along the second extending direction. The fourth main line is extended from the fourth intermediate section to the second output end and is parallel to the third main line;

Wherein, as the first transmission line pair and the second transmission line are projected to a plane parallel to the substrate, the first main line and a horizontal line parallel to the third main line compose a first angle, the second main line and a horizontal line parallel to the fourth main line compose a second angle, the first crossing line and the second crossing line cross each other and compose a third angle, the first angle and the second angle are smaller or equal to 90 degrees, the third angle is equal to 90 degrees.

In accordance with a preferred embodiment of the present invention, the first transmission line pair is a microstrip, the second transmission line is an embedded microstrip, and a gap of the first crossing section of the first transmission line pair is smaller than that of the first main line and that of the second main line.

By using the technology of the transmission line structure disclosed in the present invention, because of a smaller line width and a smaller gap between the transmission lines of the first transmission line pair at the crossing area and a smaller line width of the second transmission line at the crossing area, common-mode noise can be effectively suppressed and capacitance at the crossing area can be effectively reduced.

The embodiments in the present invention would be further discussed by using the flowing paragraphs and figures for a better understanding.

BRIEF DESCRIPTION OF THE DRAWINGS

FIG. 3A is a partially enlarged view of the transmission line structure in accordance with the first embodiment of the present invention.

FIG. 11 is a schematic view showing the time-domain waveform analysis at the first input end in accordance with the second embodiment of the present invention and the conventional art.

DETAILED DESCRIPTION OF THE INVENTION

There are various embodiments of the transmission line structure in accordance with the present invention, which are not repeated hereby. Only two preferred embodiments are mentioned in detail in the following paragraphs as an example. It should be understood by those skilled in the art that the preferred embodiments disclosed in the following paragraphs are merely an example instead of restricting the scope of the invention itself.

Figure 1:
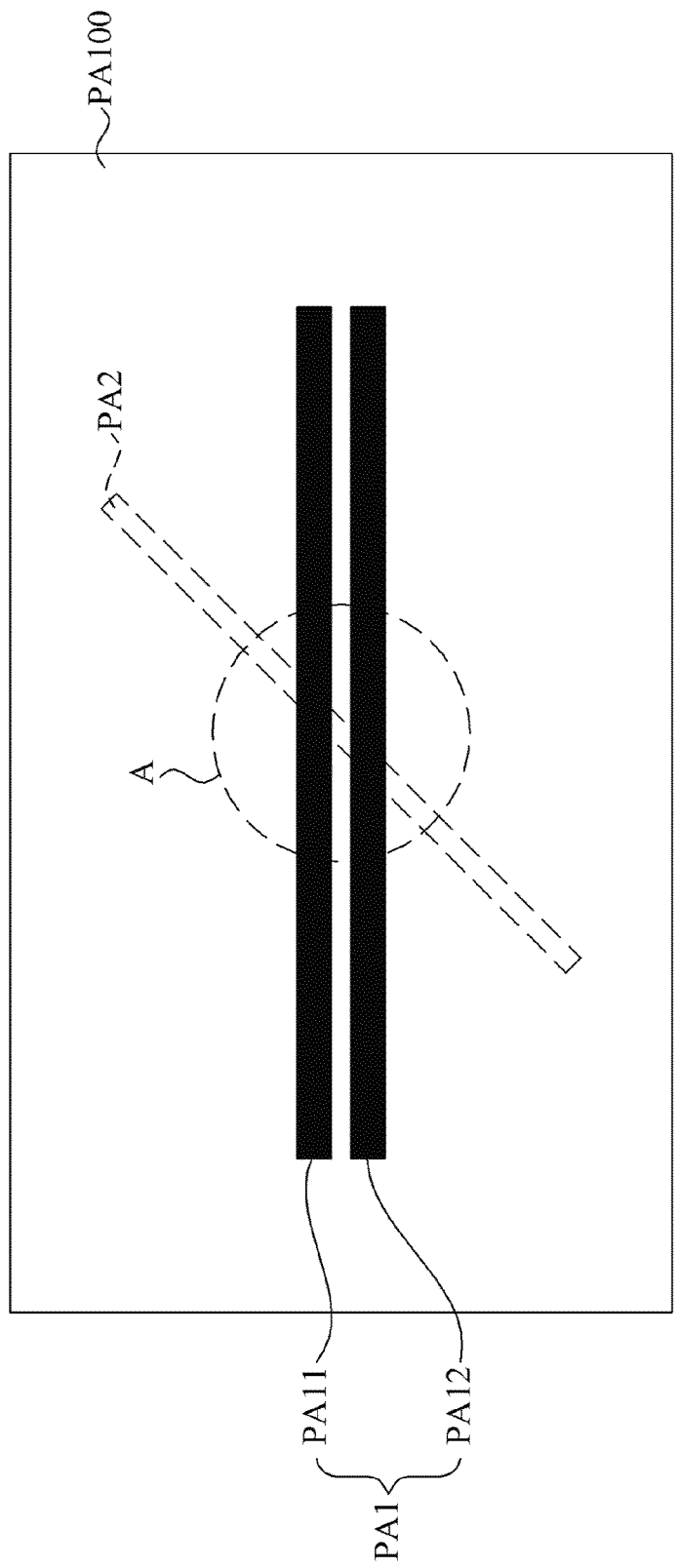
FIG. 1 is a first schematic view showing a conventional transmission line structure.
Figure 2:
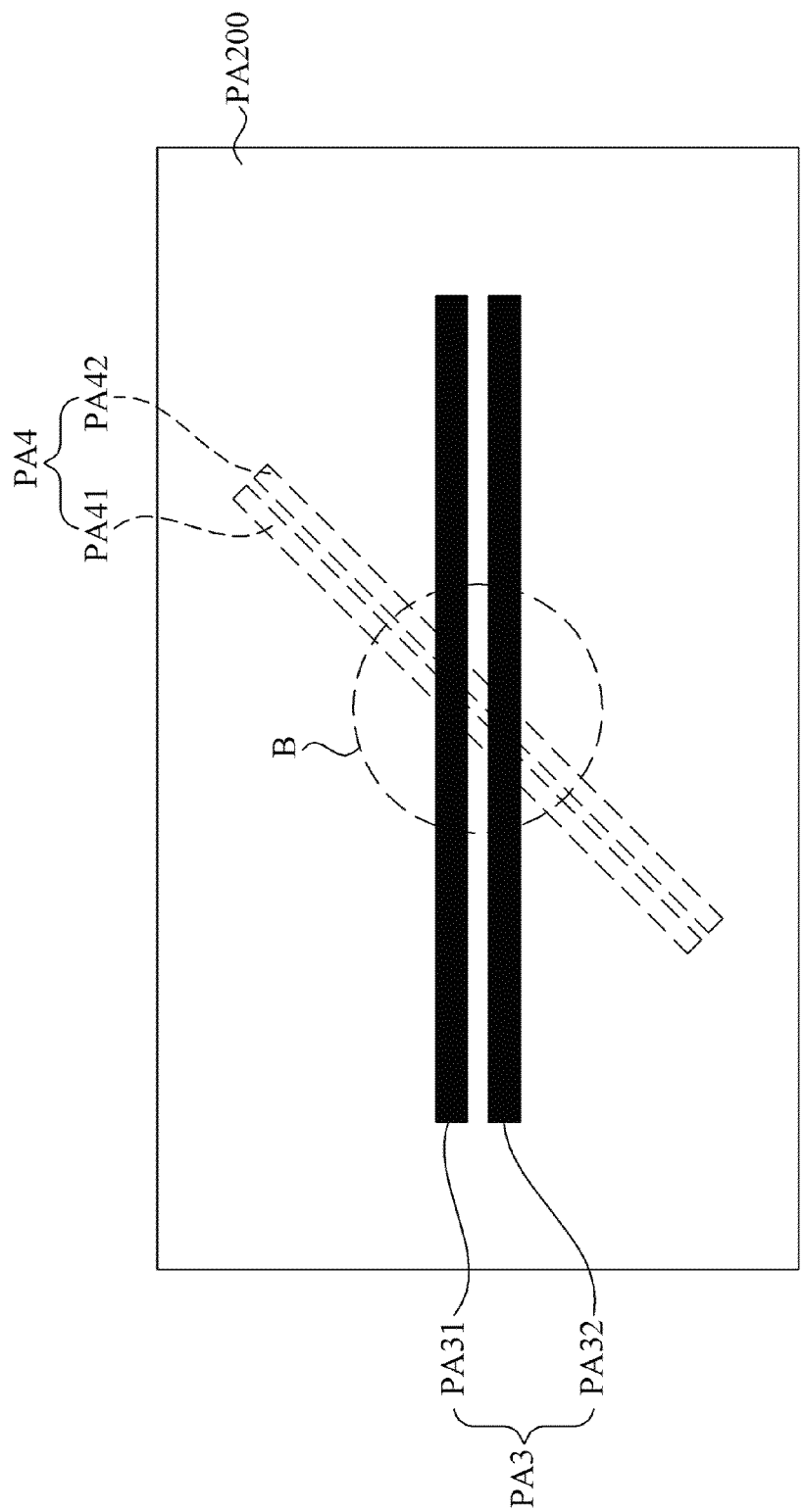
FIG. 2 is a second schematic view showing another conventional transmission line structure.
Figure 3:
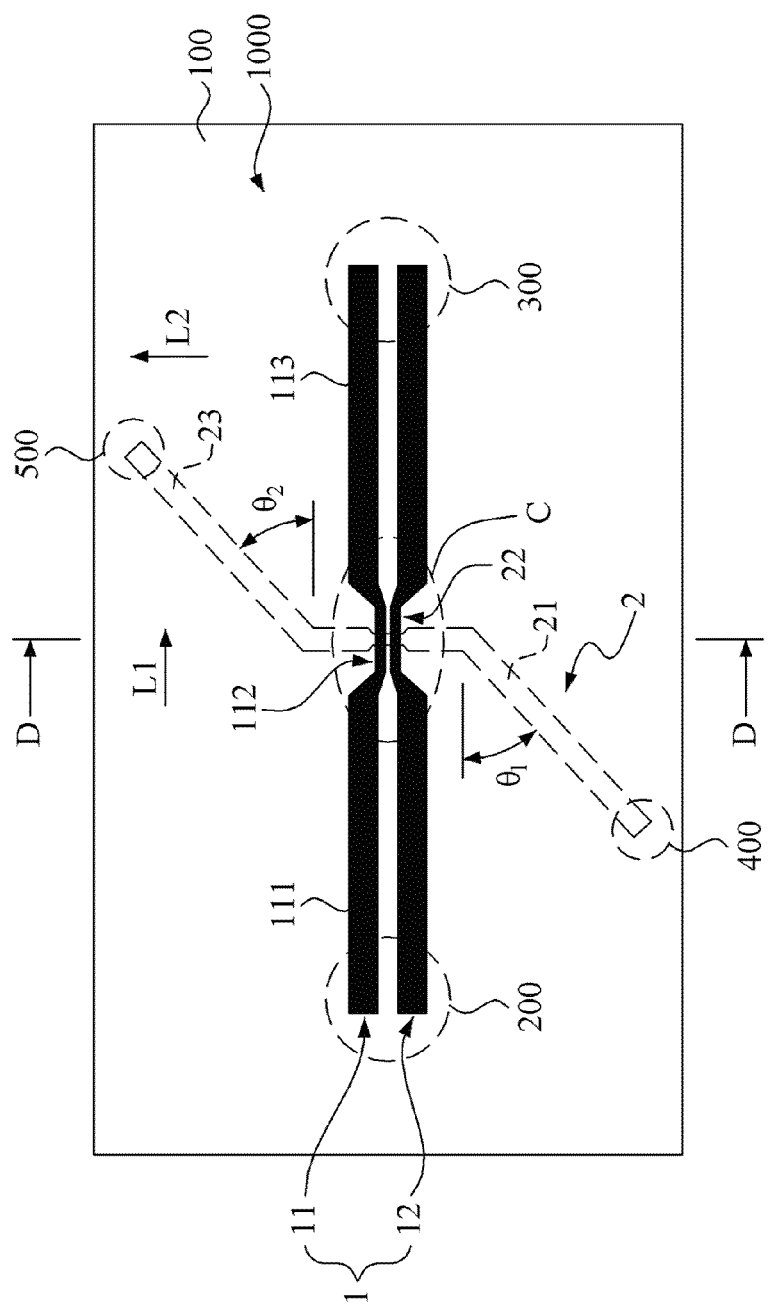
FIG. 3 is a schematic view showing a transmission line structure in accordance with a first embodiment of the present invention.
Figure 4:
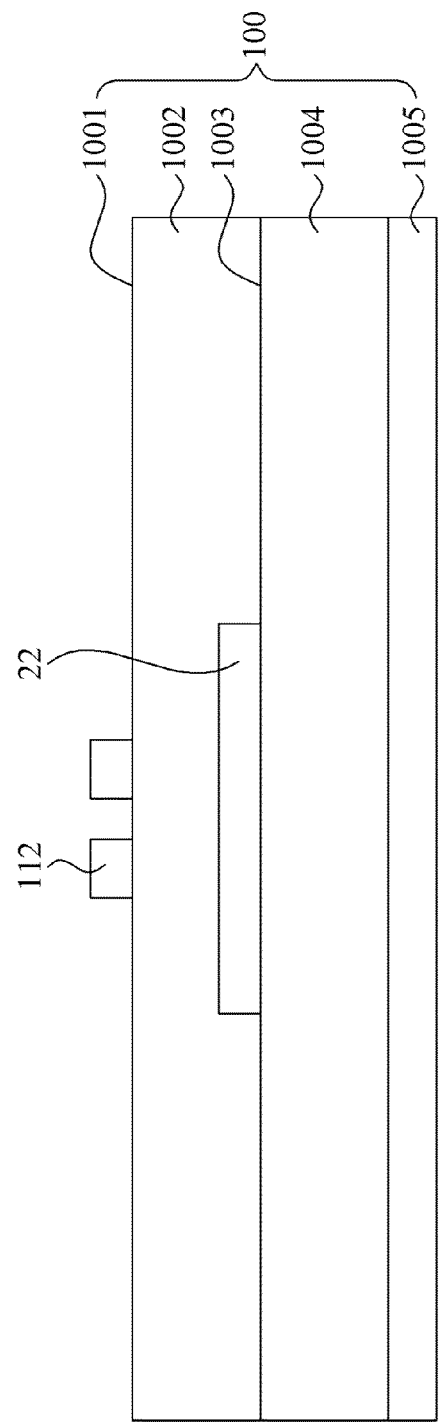
FIG. 4 is a cross-section view showing the transmission line structure in accordance with the first embodiment of the present invention.

Please refer to FIGS. 3 to 4, wherein FIG. 3 is a schematic view showing a transmission line structure in accordance with a first embodiment of the present invention; FIG. 3A is a partially enlarged view of the transmission line structure of the crossing area C in FIG. 3 in accordance with the first embodiment of the present invention; and FIG. 4 is a cross-section view showing the transmission line structure taken along the line D-D' in FIG. 3 in accordance with the first embodiment of the present invention.

As shown, a transmission line structure 1000 emplacing at a substrate 100 is provided in the present invention. The substrate 100 includes a first layout layer 1001, a first dielectric layer 1002, a second layout layer 1003, a second dielectric layer 1004, and a grounding layer 1005. The first layout layer 1001, the first dielectric layer 1002, the second layout layer 1003, the second dielectric layer 1004, and the grounding layer 1005 are stacked in a serial to form the substrate 100. That is, the first layout layer 1001 is set to cover the upper surface of the first dielectric layer 1002, the grounding layer 1005 is set to connect to the bottom surface of the second dielectric layer 1004, the second layout layer 1003 is set to connect to the second dielectric layer 1004, and the dielectric constants as well as the height of the first dielectric layer 1002 and the second dielectric layer 1004 may be identical or not according to the design in practice (for example, the dielectric constants of both the two dielectric layers can be 4.5).

The transmission line structure 1000 comprises a first transmission line pair 1 and at least one second transmission line 2. The first transmission line pair 1 is a microstrip and is composed of two transmission lines 11 and 12. The structure of the two transmission lines are corresponding to each other, and thus only the transmission line 11 is described in the following paragraphs as an example. The first transmission line pair 1 is extended from a first input end 200 to a first output end 300 and is set on the first layout layer 1001. The first transmission line pair 1 comprises a first main line 111, a first crossing line 112, and a second main line 113.

The first main line 111 is extended from the first input end 200 and has a line width w1. The first crossing line 112 is extended from the first main line 111 and comprises a first intermediate section 1121, a first crossing section 1122, and a second intermediate section 1123. The first intermediate section 1121 is connected to the first main line 111 and has a line width (not labeled in the figure) decreases along a first extending direction L1 (the horizontal direction).

The first crossing section 1122 is connected to the first intermediate section 1121 and has a fixed line width w2. The line width w2 is smaller than the line width w1 of the first main line 111. The second intermediate section 1123 is connected to the first crossing section 1122 and has a line width (not labeled in the figure) increasing along the first extending direction L1. The second main line 113 is connected to the second intermediate section 1123 and is extended to the first output end 300. The second main line 113 has a line width w3, which is identical to the line width w1 but greater than the line width w2.

In accordance with a preferred embodiment of the present invention, the gap w4 of the first crossing section 1122 of the first transmission line pair 1 is smaller than the gap w5 of the first main line 111 and the gap w6 of the second main line 113. Concretely speaking, the gap w4 between the first crossing section 1122 of the transmission line 11 and the first crossing section (not labeled in the figure) of the transmission line 12 is smaller than the gap w5 between the first main line 111 and the first main line (not labeled in the figure) of the transmission line 12, and also smaller than the gap w6 between the third main line 113 and the third main line (not labeled in the figure) of the transmission line 12.

The second transmission line 2 is a single embedded microstrip, which does not have a coupled transmission line to form a transmission line pair. The second transmission line 2 is extended from a second input end 400 to a second output end 500 and is set on the second layout layer 1003. The second transmission line 2 also comprises a third main line 21, a second crossing line 22, and a fourth main line 23. The third main line 21 is extended from the second input end 400 and has a line width w7. The second crossing line 22 comprises a third intermediate section 221, a second crossing section 222, and a fourth intermediate section 223. The third intermediate section 221 is connected to the third main line 21 and has a line width (not labeled in the figure) decreasing along a second extending direction L2 (the vertical direction).

The second crossing section 222 is connected to the third intermediate section 221 and has a fixed line width w8. The line width w8 is smaller than the line width w7. The fourth intermediate section 223 is connected to the second crossing section 222 and has a line width (not labeled in the figure) increasing along the second extending direction L2. The fourth main line 23 is extended from the fourth intermediate section 223 to the second output end 500 and is parallel to the third main line 21. The line width w9 of the fourth main line 23 is identical to the line width w7.

Wherein, as the first transmission line pair 1 and the second transmission line 2 are projected to a plane parallel to the substrate 100, i.e. the condition as shown in FIG. 3, the first main line 111 and a horizontal line parallel to the third main line 21 compose a first angle θ1, the second main line 113 and a horizontal line parallel to the fourth main line 23 compose a second angle θ2, the first crossing section 1122 and the second crossing section 222 cross each other to compose a third angle θ3, the first angle θ1 and the second angle θ2 are smaller or equal to 90 degrees, i.e. ranged between 0 to 90 degrees, and the third angle θ3 is equal to 90 degrees. The meaning of crossing in the present embodiment indicates the crossing of transmission lines on the different layers or also understood as striding over, and both the first angle θ1 and the second angle θ2 are 45 degrees in the present embodiment.

Figure 5:
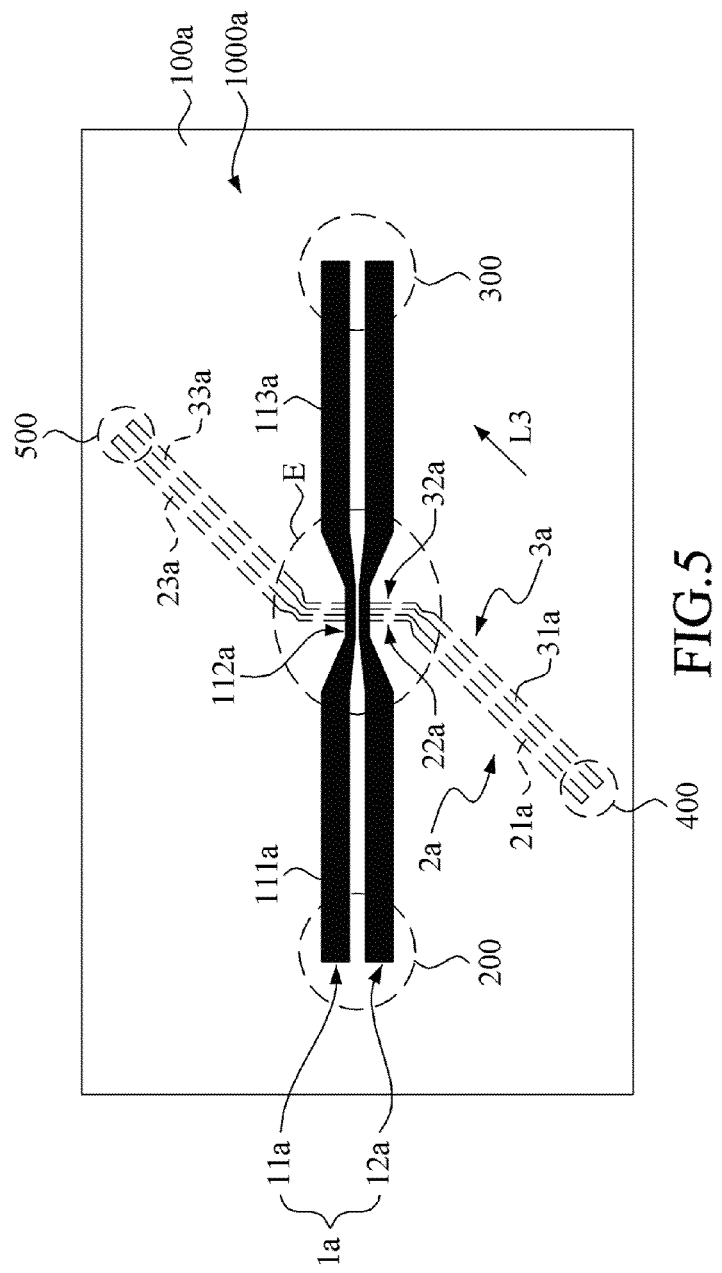
FIG. 5 is a schematic view showing a transmission line structure in accordance with a second preferred embodiment of the present invention.
Figure 5A:
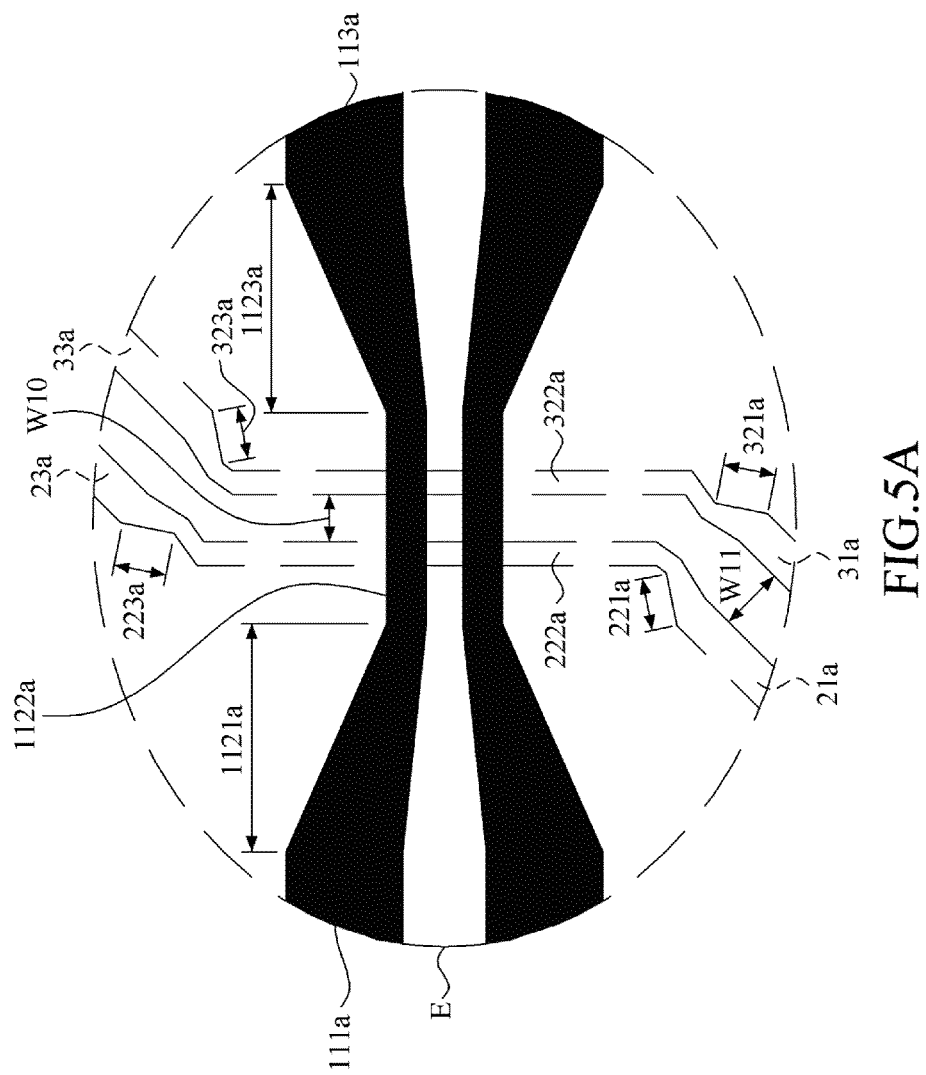
FIG. 5A is a partially enlarged view showing the transmission line structure in accordance with the second preferred embodiment of the present invention.

Please refer to FIG. 5 and FIG. 5A, wherein FIG. 5 is a schematic view showing a transmission line structure in accordance with a second preferred embodiment of the present invention and FIG. 5A is a partially enlarged view showing the transmission line structure of the crossing area E in FIG. 5 in accordance with the second preferred embodiment of the present invention. As shown, the transmission line structure 1000a emplacing on a substrate 100a (the substrate 100a is the same as that of the first embodiment) includes a first transmission line pair 1a, a second transmission line 2a, and a third transmission line 3a. The first transmission line pair 1a, which is composed of two transmission lines 11a and 12a, is the same as that of the first embodiment, and also includes a first main line 111a, a first crossing line 112a, and a second main line 113a.

Similar to the first embodiment, the second transmission line 2a also includes a third main line 21a, a second crossing line 22a, and a fourth main line 23a. However, the present embodiment is different from the first embodiment in that the line width (not labeled in the figure) of the third intermediate section 221a of the second crossing line 22a decreases along a third extending direction L3, the line width of the fourth intermediate section 223a increases along the third extending direction L3, and the third extending direction L3 is different from the first extending direction L1 and the second extending direction L2 mentioned in the first embodiment. Concretely speaking, the third extending direction L3 of the second embodiment is a tilted direction parallel to the third main line 21a and the fourth main line 23a.

The third transmission line 3a is parallel to the second transmission line 2a and is also extended from a second input end (not labeled in the figure) to a second output end (not labeled in the figure). That is, the third transmission line 3a and the second transmission line 2a compose a transmission line pair. The third transmission line 3a includes a third main line 31a, a second crossing line 32a, and a fourth main line 33a. The line width of the third main line 31a is identical to that of the third main line 21a. The second crossing line 32a includes a third intermediate section 321a, a second crossing section 322a, and a fourth intermediate section 323a. The third intermediate section 321a is connected to the third main line 31a, and the line width of the third intermediate section 321a (not labeled in this figure) decreases along the third extending direction L3. The fourth intermediate section 323a has a line width (not labeled in the figure) increases along the third extending direction L3 and is connected to the fourth main line 33a.

In addition, the gap w10 between the second crossing section 222a and the second crossing section 322a is smaller than the gap w11 between the third main line 21a and the third main line 31a, i.e. the second transmission line 2a is close to the third transmission line 3a just as the lines at the crossing area of the first transmission line pair 1a to reduce the capacitance at the crossing area. The other portions of the present embodiment are identical to the first embodiment and thus are not repeated here.

Figure 6:
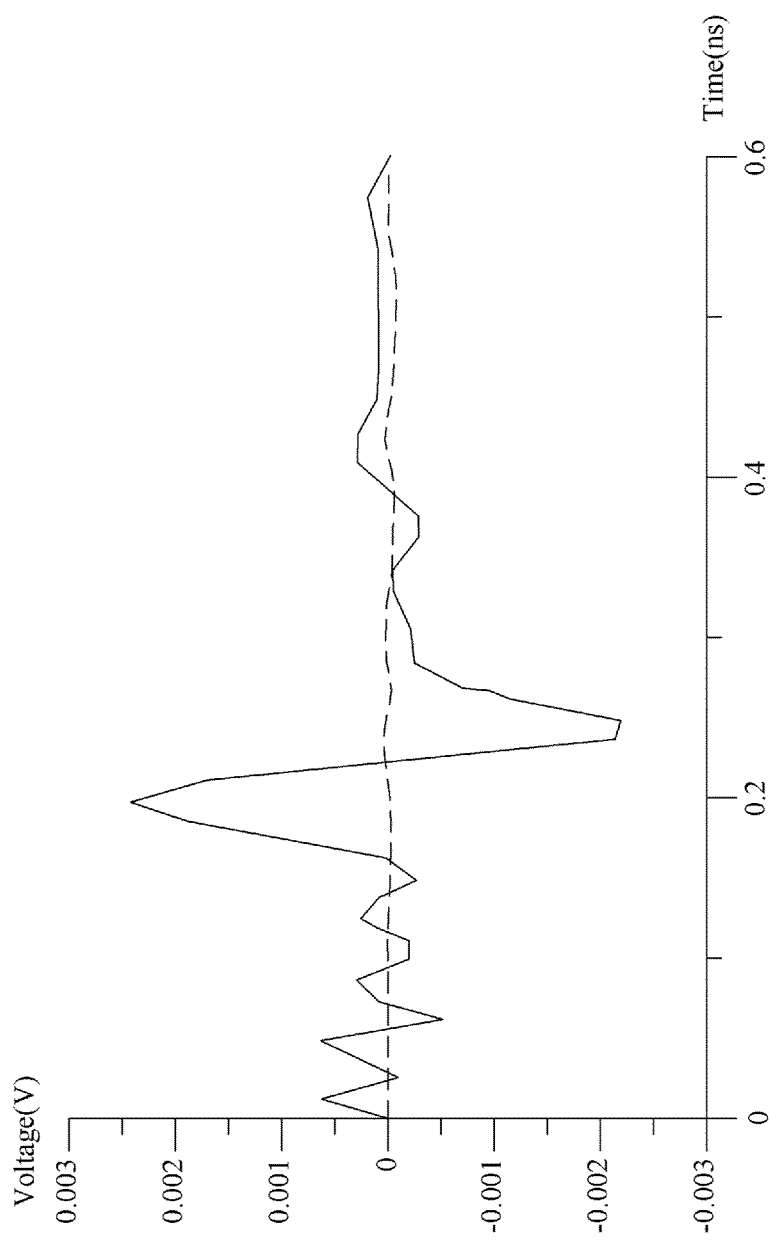
FIG. 6 is a schematic view showing the time-domain waveform analysis at the first output end in accordance with the first embodiment of the present invention and the conventional art.
Figure 6A:
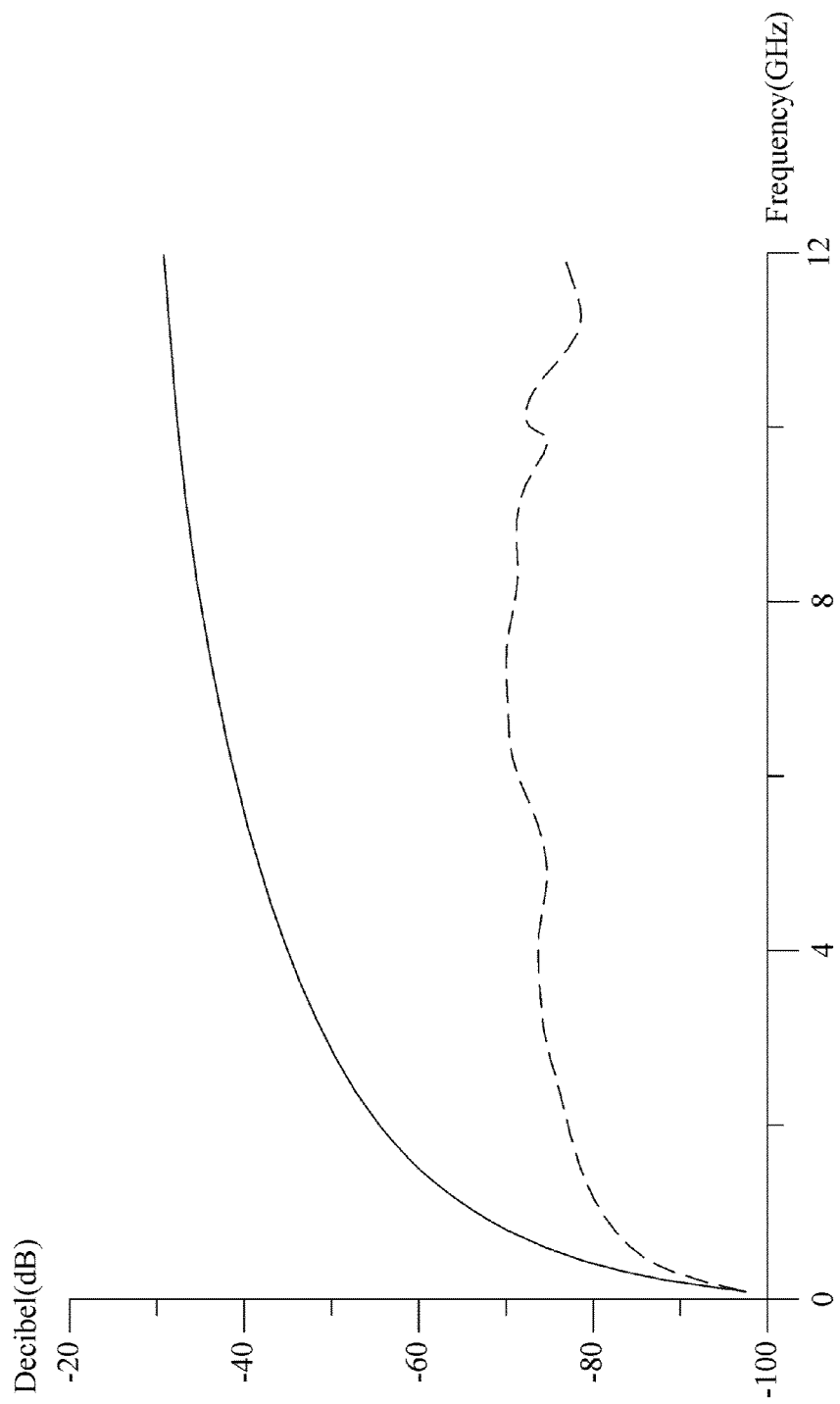
FIG. 6A is a schematic view showing the frequency-domain waveform analysis at the first output end in accordance with the first embodiment of the present invention and the conventional art.
Figure 7:
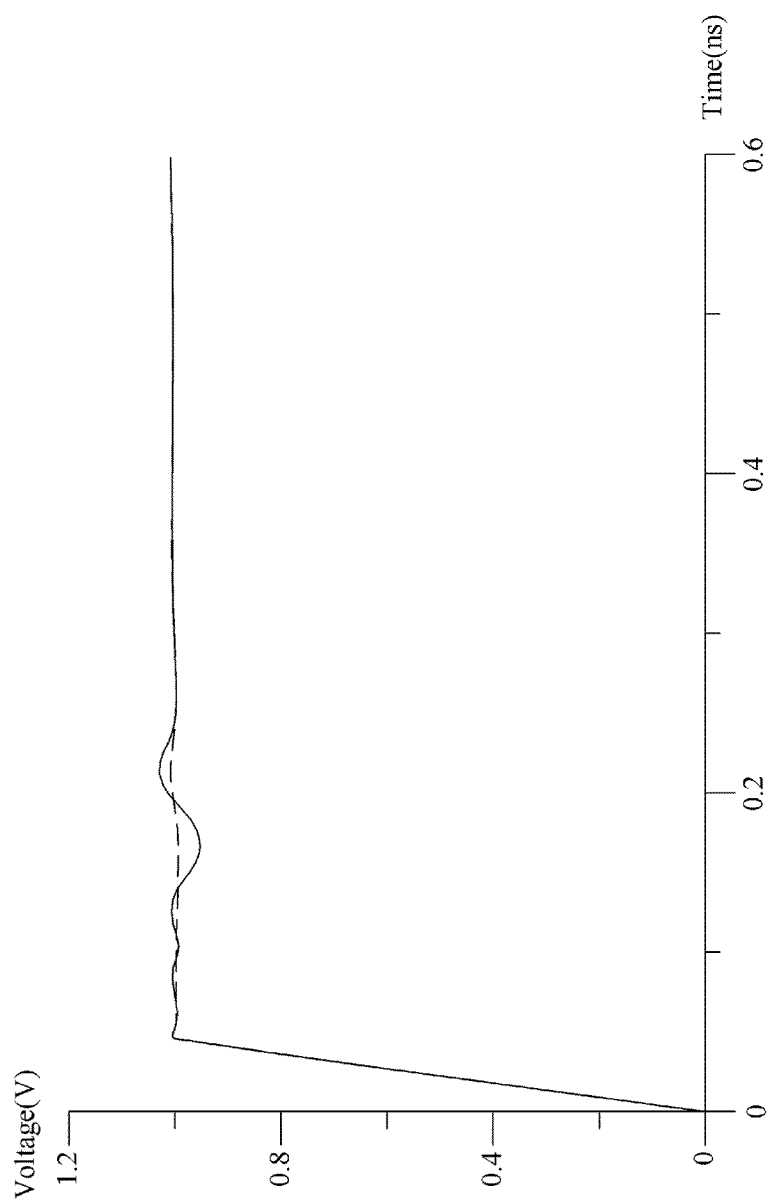
FIG. 7 is a schematic view showing the time-domain waveform analysis at the first input end in accordance with the first embodiment of the present invention and the conventional art.
Figure 7A:
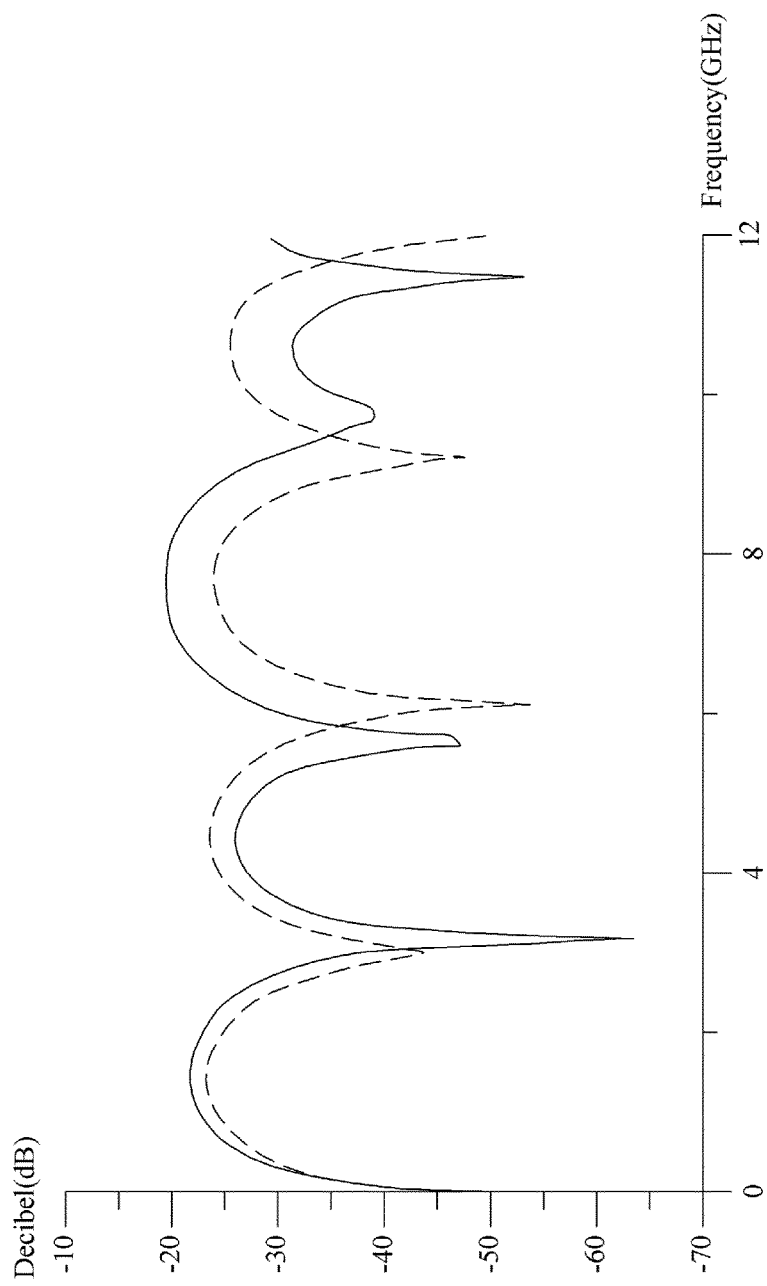
FIG. 7A is a schematic view showing the frequency-domain waveform analysis at the first input end in accordance with the first embodiment of the present invention and the conventional art.
Figure 8:
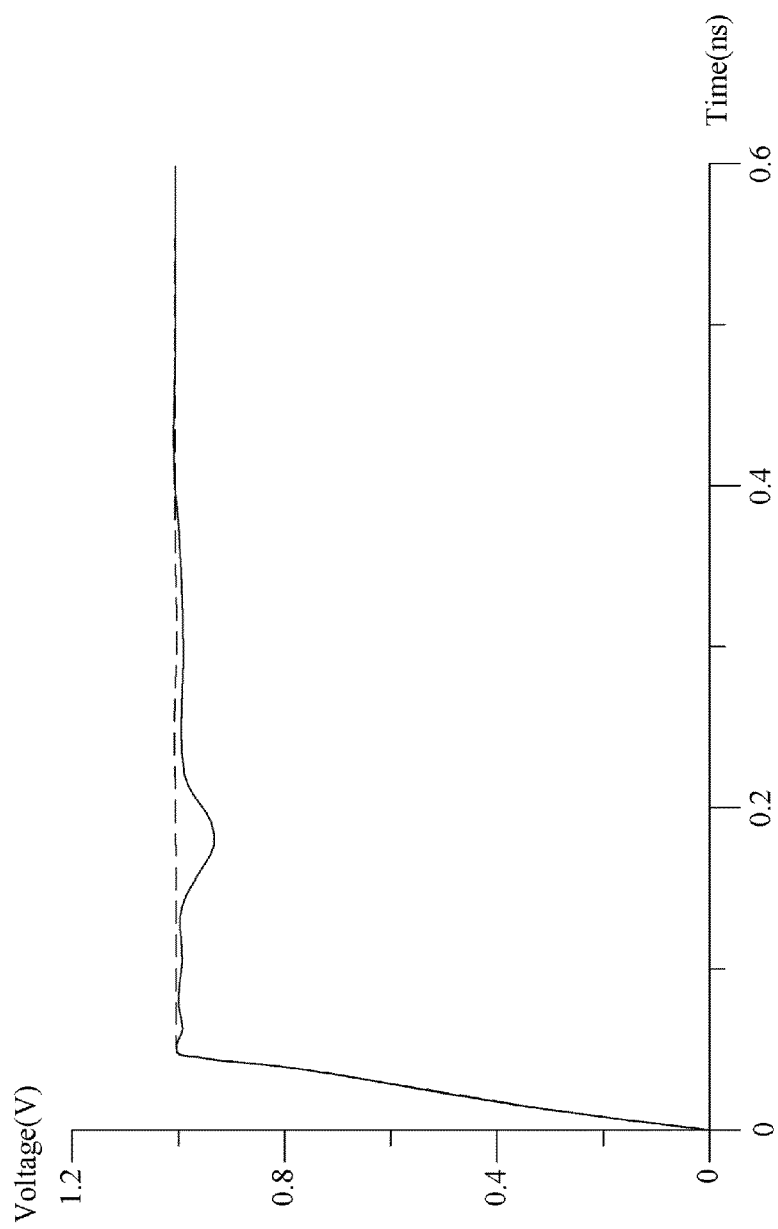
FIG. 8 is a schematic view showing the time-domain waveform analysis at the second input end in accordance with the first embodiment of the present invention and the conventional art.
Figure 8A:
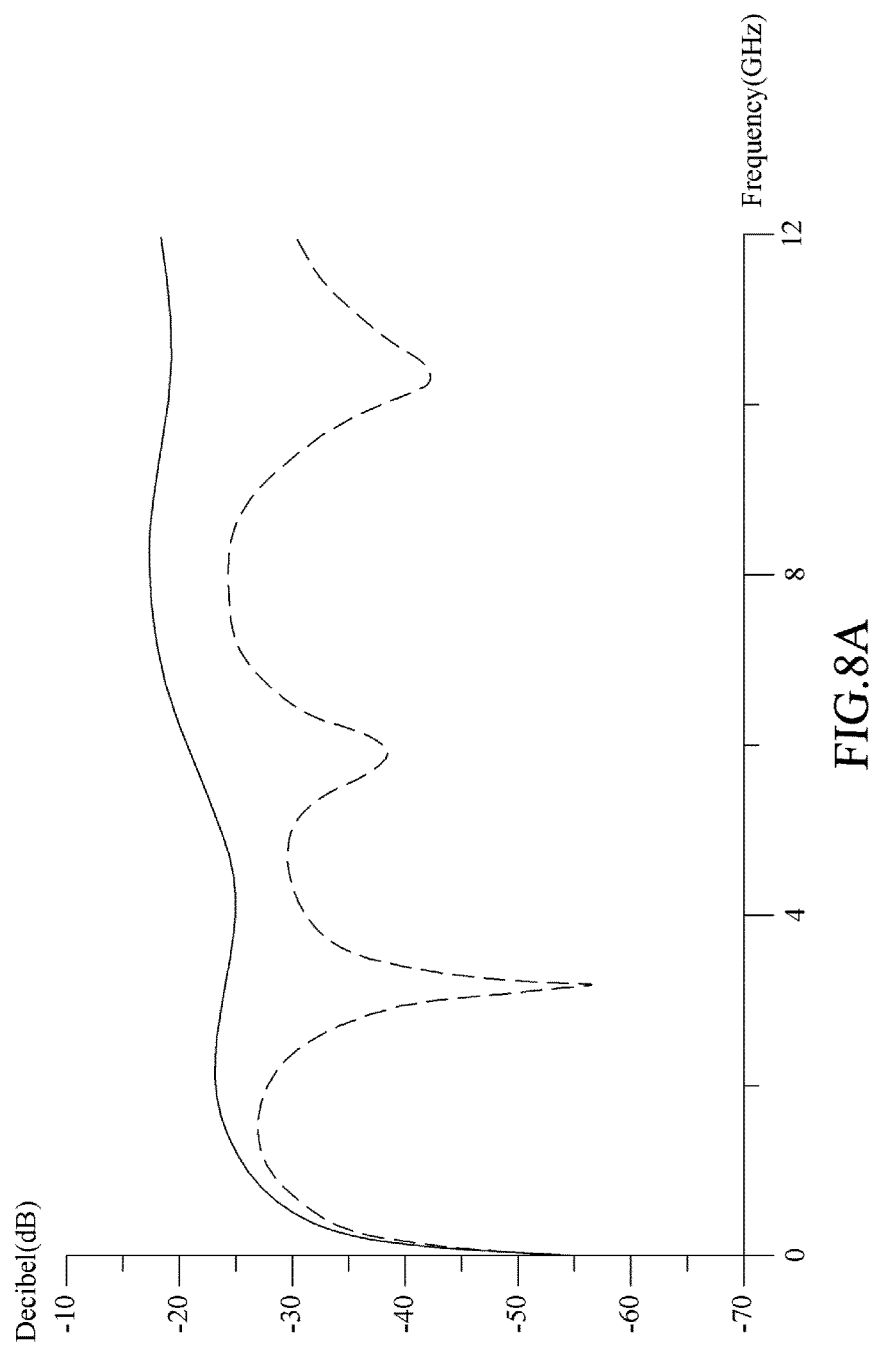
FIG. 8A is a schematic view showing the frequency-domain waveform analysis at the second input end in accordance with the first embodiment of the present invention and the conventional art.

Please refer to FIGS. 6, 6A, 7, 7A, 8 and 8A, wherein FIG. 6 is a schematic view showing the time-domain waveform analysis at the first output end in accordance with the first embodiment of the present invention and the conventional art, FIG. 6A is a schematic view showing the frequency-domain waveform analysis at the first output end in accordance with the first embodiment of the present invention and the conventional art, FIG. 7 is a schematic view showing the time-domain waveform analysis at the first input end in accordance with the first embodiment of the present invention and the conventional art, FIG. 7A is a schematic view showing the frequency-domain waveform analysis at the first input end in accordance with the first embodiment of the present invention and the conventional art, FIG. 8 is a schematic view showing the time-domain waveform analysis at the second input end in accordance with the first embodiment of the present invention and the conventional art, and FIG. 8A is a schematic view showing the frequency-domain waveform analysis at the second input end in accordance with the first embodiment of the present invention and the conventional art.

As shown in FIGS. 6, 7 and 8, the Voltage (V) indicates the measured voltage of the transmission line and, the Time (ns) indicates the measured time. As shown in FIGS. 6A, 7A and 8A, the Decibel (dB) represents the measured decibel of the transmission line and, the Frequency (GHz) indicated the measured frequency, the solid line indicates the waveform simulation of the transmission line structure of the conventional art and the dashed line indicates the waveform simulation of the transmission line structure 1000 in accordance with the first embodiment of the present invention. Please refer to FIG. 6 and FIG. 6A, it shows that the delay time of the transmission line pair PA1 of the transmission line structure provide in the conventional art does not match at the crossing area and thus may generate a greater common-mode noise. In contrast, the first transmission line pair 1 of the transmission line structure 1000 in the first embodiment of the present invention has the features of closely positioned lines and shrunk line width, which can match the delay time effectively so as to reduce the common-mode noise.

Please refer to FIG. 7 and FIG. 7A, it shows that the transmission line pair PA1 of the transmission line structure provided in the conventional art has a higher capacitance. After adopting the transmission line pair with the technical features of closely positioned lines and shrunk line width, the waveform is flattened and the amplitude is reduce such that a smaller capacitance can be achieved. In addition, please refer to FIG. 8 and FIG. 8A, it shows that the transmission line PA2 of the transmission line structure provided in the conventional art has a higher capacitance at the crossing area. After adopting the transmission line pair PA1 with the technical features of closely positioned lines and shrunk line width and adopting the transmission line PA2 with the technical feature of shrunk line width at the crossing area, the waveform is flattened and the amplitude is reduce such that a smaller capacitance can be achieved.

Figure 9:
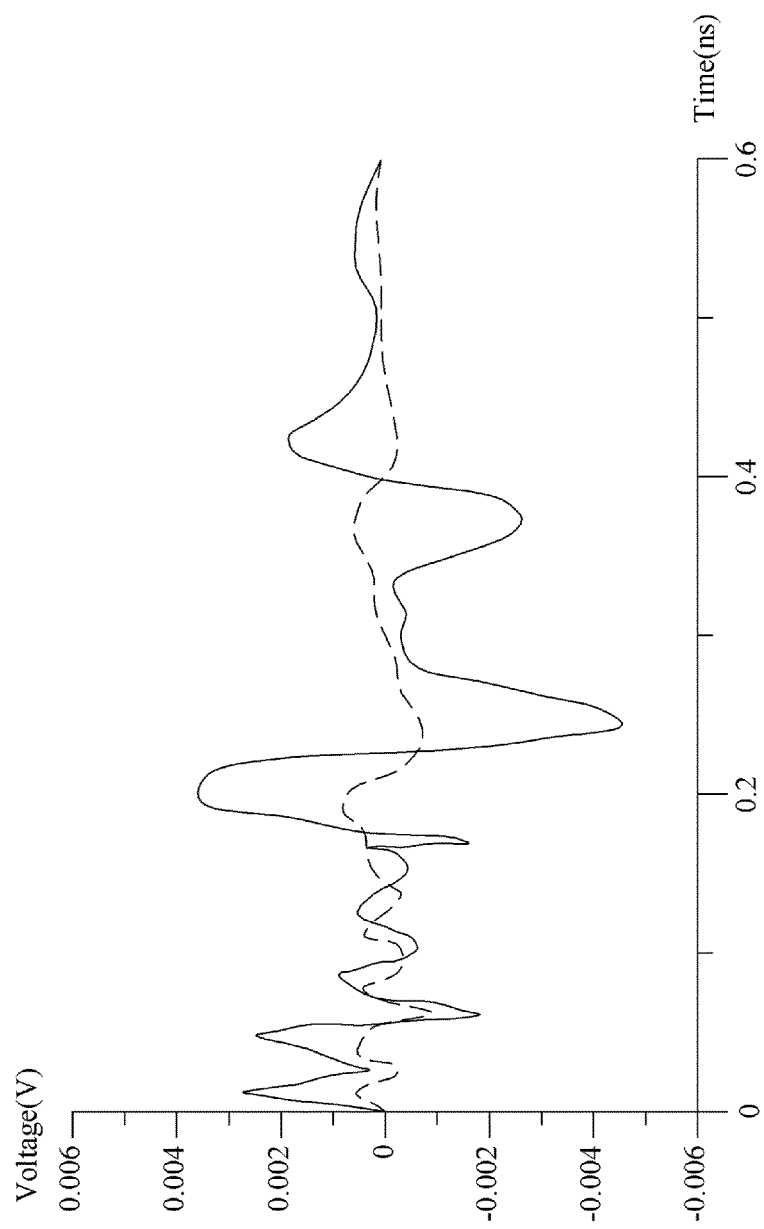
FIG. 9 is a schematic view showing the time-domain waveform analysis at the first output end in accordance with the second embodiment of the present invention and the conventional art.
Figure 9A:
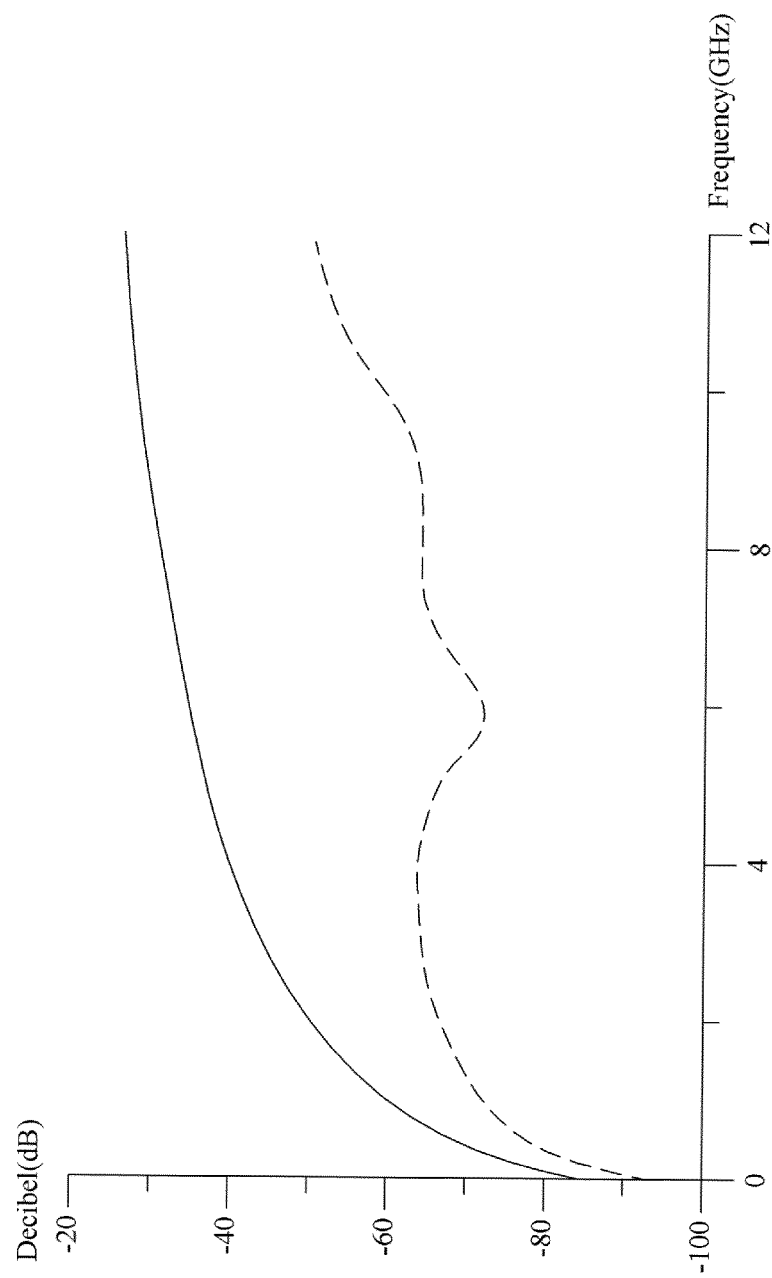
FIG. 9A is a schematic view showing the frequency-domain waveform analysis at the first output end in accordance with the second embodiment of the present invention and the conventional art.
Figure 10:
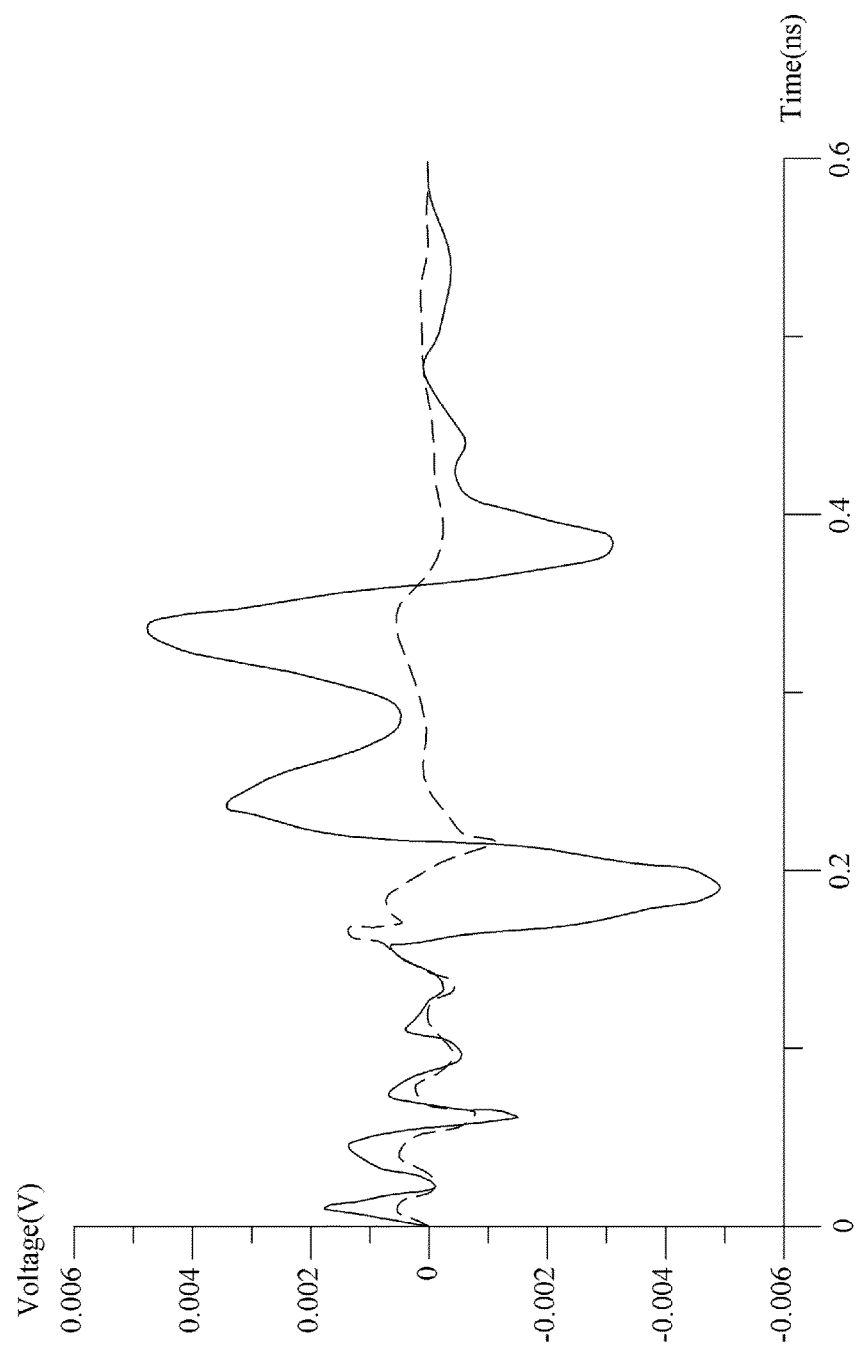
FIG. 10 is a schematic view showing the time-domain waveform analysis at the second output end in accordance with the second embodiment of the present invention and the conventional art.
Figure 10A:
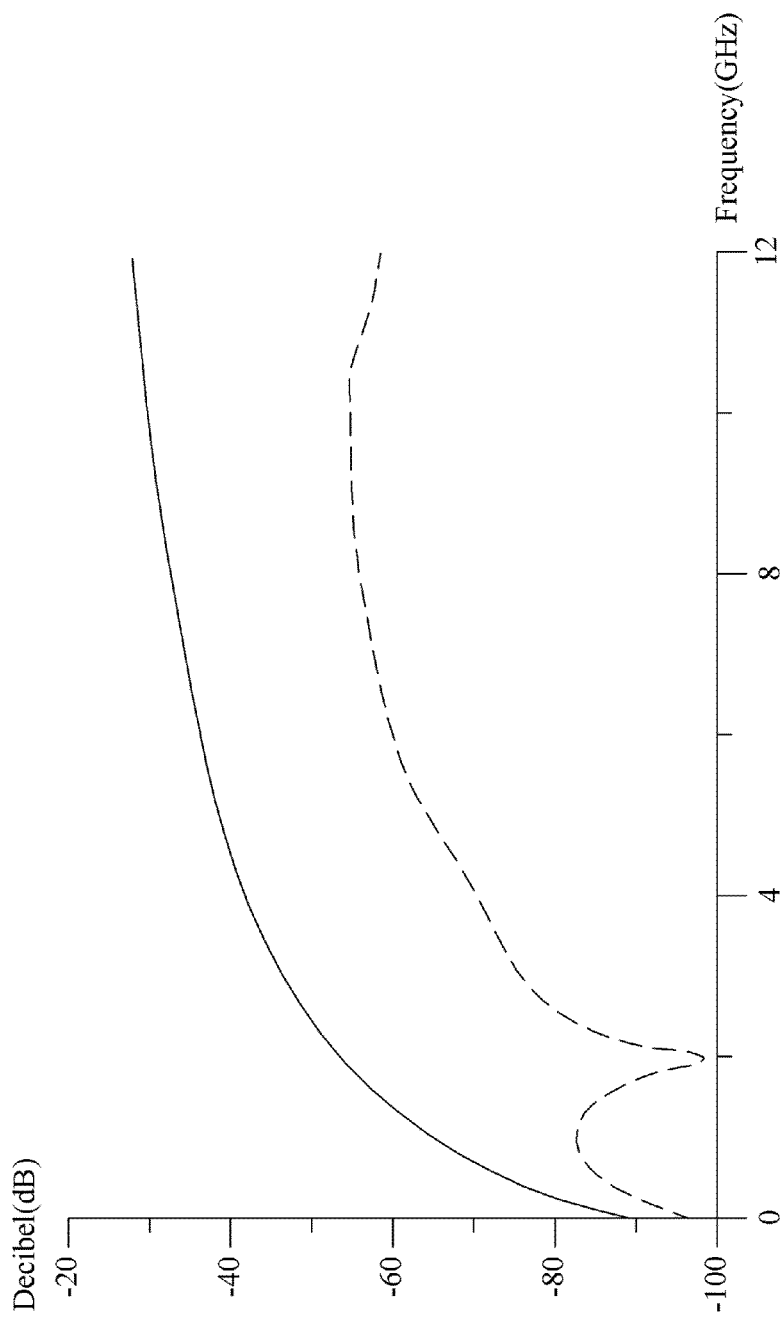
FIG. 10A is a schematic view showing the frequency-domain waveform analysis at the second output end in accordance with the second embodiment of the present invention and the conventional art.
Figure 11A:
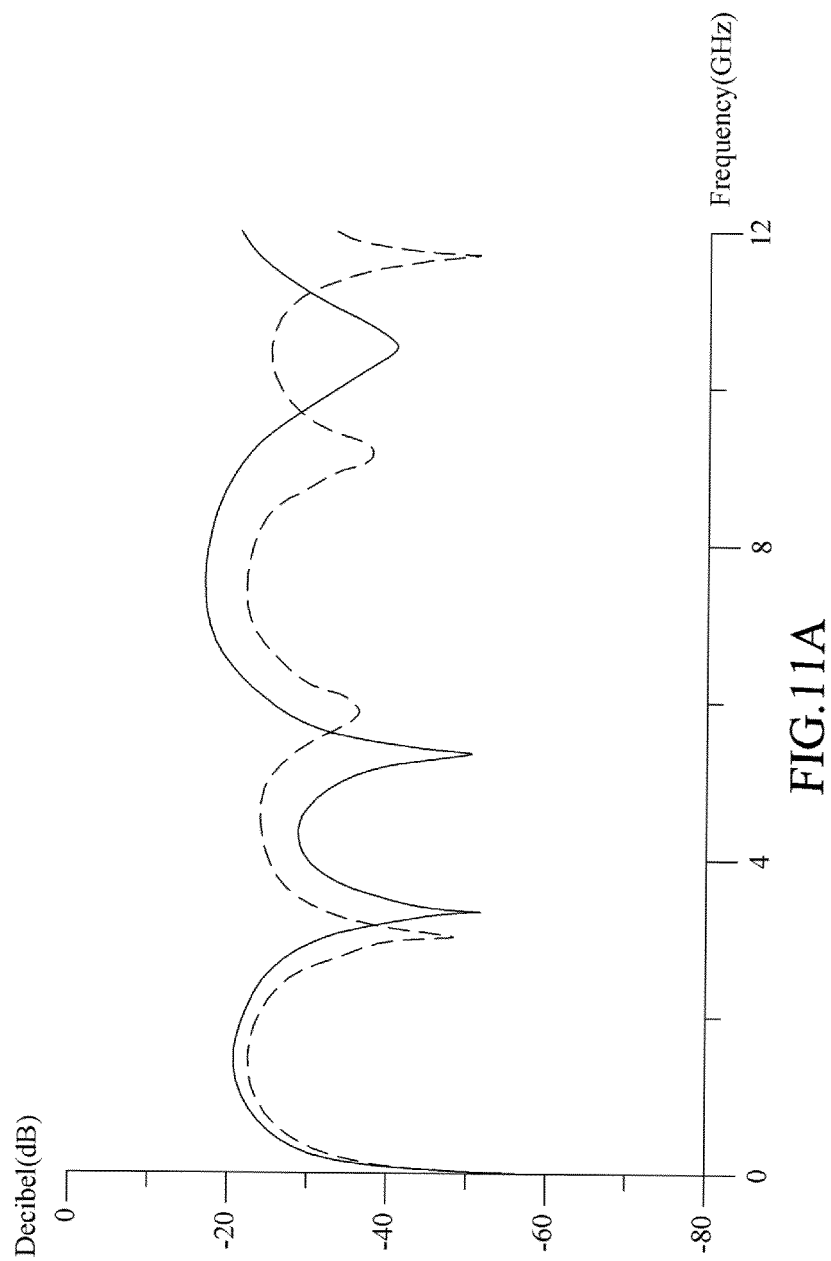
FIG. 11A is a schematic view showing the frequency-domain waveform analysis at the first input end in accordance with the second embodiment of the present invention and the conventional art.
Figure 12:
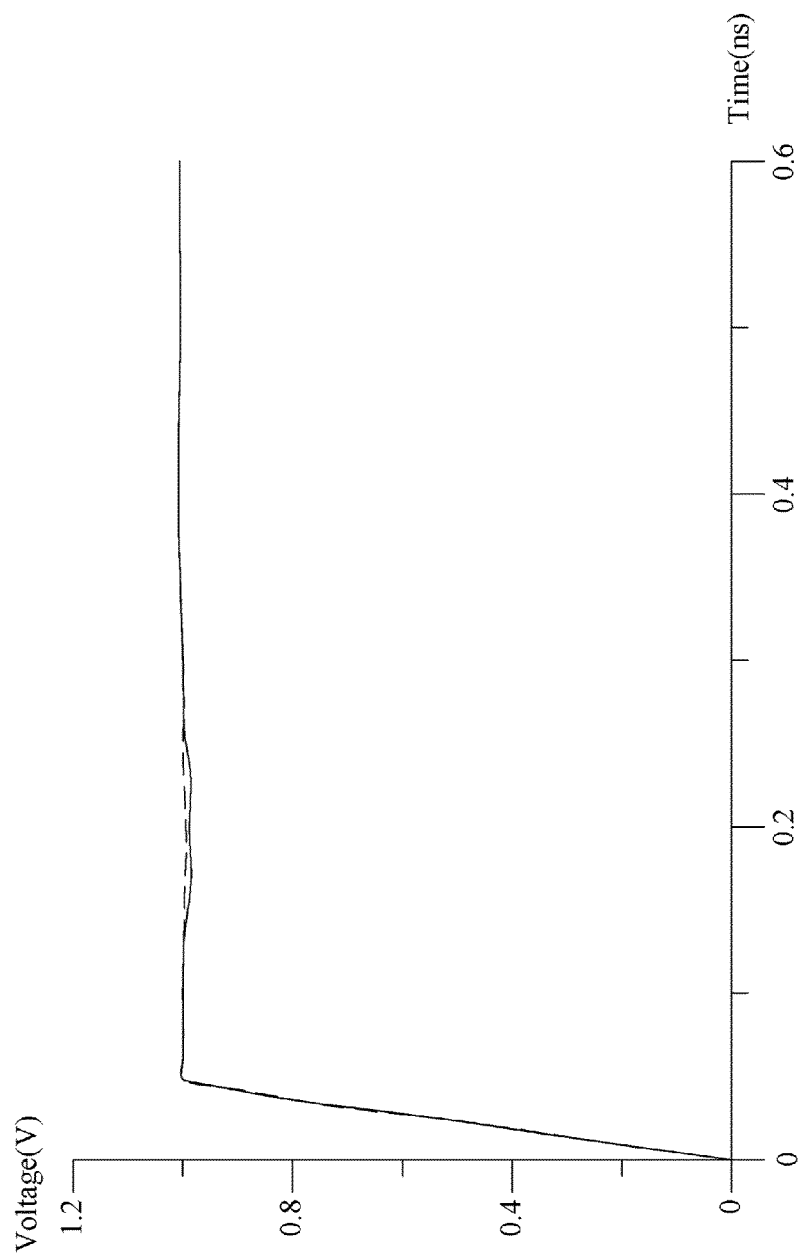
FIG. 12 is a schematic view showing the time-domain waveform analysis at the second input end in accordance with the second embodiment of the present invention and the conventional art.
Figure 12A:
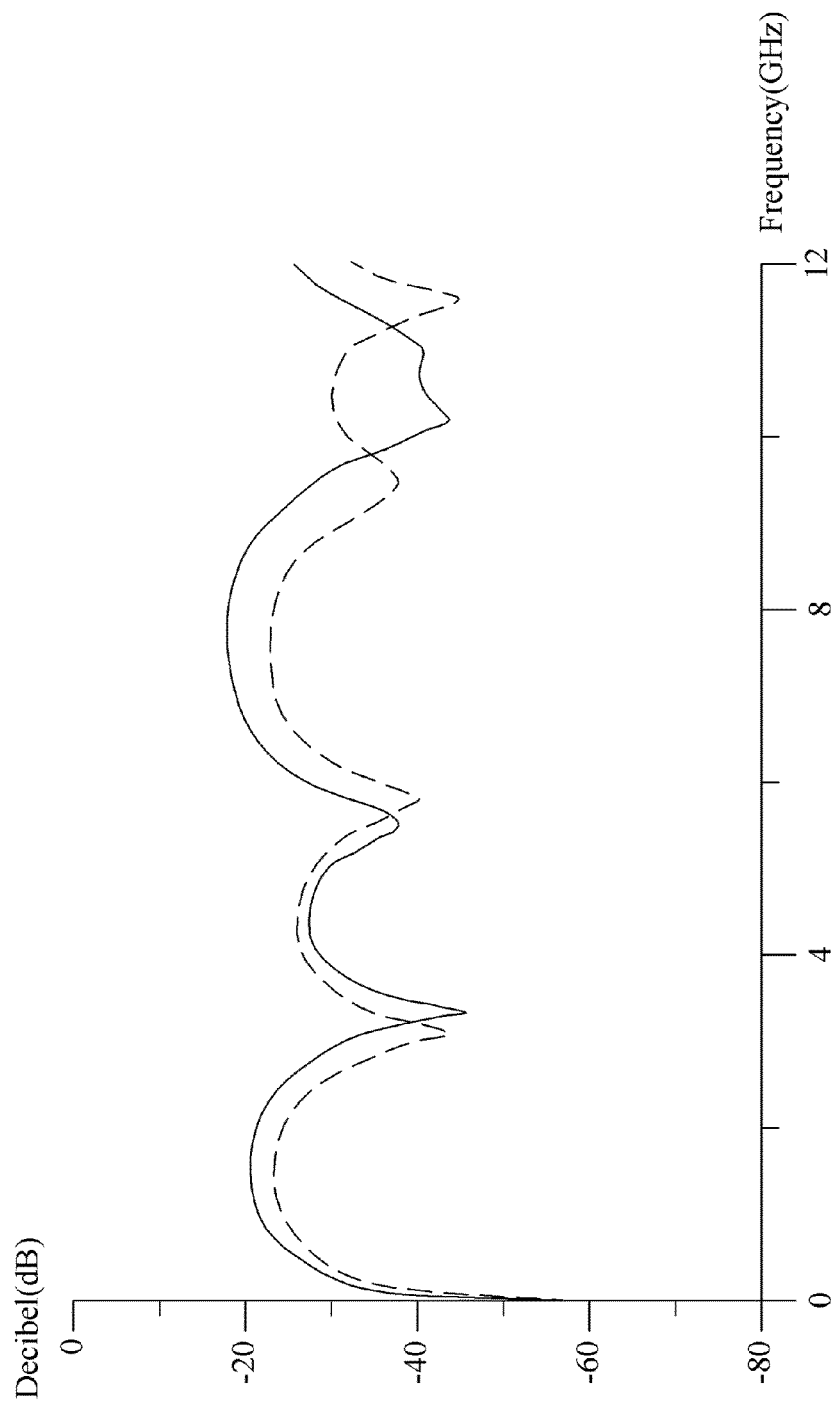
FIG. 12A is a schematic view showing the frequency-domain waveform analysis at the second input end in accordance with the second embodiment of the present invention and the conventional art.

Please refer to FIGS. FIGS. 9, 9A, 10, 10A, 11, 11A, 12 and 12A, in which FIG. 9 is a schematic view showing the time-domain waveform analysis at the first output end in accordance with the second embodiment of the present invention and the conventional art, FIG. 9A is a schematic view showing the frequency-domain waveform analysis at the first output end in accordance with the second embodiment of the present invention and the conventional art, FIG. 10 is a schematic view showing the time-domain waveform analysis at the second output end in accordance with the second embodiment of the present invention and the conventional art, FIG. 10A is a schematic view showing the frequency-domain waveform analysis at the second output end in accordance with the second embodiment of the present invention and the conventional art, FIG. 11 is a schematic view showing the time-domain waveform analysis at the first input end in accordance with the second embodiment of the present invention and the conventional art, FIG. 11A is a schematic view showing the frequency-domain waveform analysis at the first input end in accordance with the second embodiment of the present invention and the conventional art, FIG. 12 is a schematic view showing the time-domain waveform analysis at the second input end in accordance with the second embodiment of the present invention and the conventional art, and FIG. 12A is a schematic view showing the frequency-domain waveform analysis at the second input end in accordance with the second embodiment of the present invention and the conventional art.

As shown in FIGS. 9, 10, 11 and 12, the Voltage (V) indicates the measured voltage of the transmission line and, the Time (ns) indicates the measured time. As shown in FIGS. 9A, 10A, 11A and 12A, the Decibel (dB) represents the measured decibel of the transmission line and, the Frequency (GHz) indicated the measured frequency, the solid line indicates the waveform simulation of the transmission line structure of the conventional art and the dashed line indicates the waveform simulation of the transmission line structure 1000 in accordance with the second embodiment of the present invention. Please refer to FIG. 9 and FIG. 9A, it shows that the delay time of the transmission line pair PA3 of the transmission line structure provided in the conventional art does not match at the crossing area and thus may generate a greater common-mode noise. In contrast, the first transmission line pair 1a of the transmission line structure 1000 in the second embodiment of the present invention has the features of closely positioned lines and shrunk line width, which can match the delay time effectively so as to reduce the common-mode noise.

Please refer to FIG. 10 and FIG. 10A, it shows a greater amplitude at the crossing area of the transmission line pair PA4 of the transmission line structure provided in the conventional art under the differential-to-common mode conversion. After adopting the transmission line pair with the technical features of closely positioned lines and shrunk line width, the waveform is flattened and the amplitude is reduced.

Please refer to FIG. 11 and FIG. 11A, it shows that the transmission line pair PA3 of the transmission line structure provided in the conventional art has a higher capacitance. After adopting the transmission line pair with the technical features of closely positioned lines and shrunk line width, the waveform is flattened and the amplitude is reduce such that a smaller capacitance can be achieved. In addition, please refer to FIG. 12 and FIG. 12A, it shows that the transmission line pair PA4 of the transmission line structure provided in the conventional art has a higher capacitance at the crossing area. After adopting the second transmission line 2a and the third transmission line 3a with the technical features of closely positioned lines and shrunk line width, the waveform is flattened and the amplitude is reduce such that a smaller capacitance can be achieved.

In conclusion, the spirit of the present invention is to adopt the transmission lines with the technical features of closely positioned lines and shrunk line width at the crossing area such that the capacitance and the common-mode noise can be effectively reduced. It is also noted that this technology can be easily applied to the existing high speed digital circuits.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

I claim:

1. A transmission line structure, arranged at a substrate which includes a first layout layer, a first dielectric layer, a second layout layer, a second dielectric layer, and a grounding layer, the first layout layer being set on the first dielectric layer, the first dielectric layer being set on the second layout layer, the second layout layer being set on the second dielectric layer, and the second dielectric layer being set on the grounding layer, and the transmission line structure comprising:

a first transmission line pair, extended from a first input end to a first output end and set on the first layout layer, comprising:
 a first main line, extended from the first input end;
 a first crossing line, comprising:
  a first intermediate section, connected to the first main line, and having a line width decreasing along a first extending direction;
  a first crossing section, connected to the first intermediate section, and having a fixed line width; and
  a second intermediate section, connected to the first crossing section, and having a line width increasing along the first extending direction; and
 a second main line, connected to the second intermediate section of the first crossing line and extended to the first output end; and at least one second transmission line, extended from a second input end to a second output end and set on the second layout layer, comprising:
 a third main line, extended from the second input end;
 a second crossing line, comprising:
  a third intermediate section, connected to the third main line and having a line width decreasing along a second extending direction;
  a second crossing section, connected to the third intermediate section and having a fixed line width; and
  a fourth intermediate section, connected to the second crossing section of the second crossing line and having a width increasing along the second extending direction; and
 a fourth main line, extended from the fourth intermediate section to the second output end and parallel to the third main line;

wherein as the first transmission line pair and the second transmission line are projected to a plane parallel to the substrate, the first main line and a horizontal line parallel to the third main line compose a first angle, the second main line and a horizontal line parallel to the fourth main line compose a second angle, the first crossing line and the second crossing line cross each other and compose a third angle, the first angle and the second angle are smaller than 90 degrees, and the third angle is equal to 90 degrees.

2. The transmission line structure of claim 1, wherein the first transmission line pair is a microstrip.

3. The transmission line structure of claim 1, wherein the second transmission line is an embedded microstrip.

4. The transmission line structure of claim 1, wherein a gap is formed between the first transmission line pair, the gap at the first crossing section of the first transmission line pair is smaller than gap at the first main line and gap at the second main line.

* * * * *